(12) United States Patent
Duan et al.

(10) Patent No.: US 11,981,228 B2
(45) Date of Patent: May 14, 2024

(54) BATTERY HEALTH MONITORING AND FAILURE IDENTIFICATION

(71) Applicant: GM GLOBAL TECHNOLOGY OPERATIONS LLC, Detroit, MI (US)

(72) Inventors: Shiming Duan, Ann Arbor, MI (US); Chaitanya Sankavaram, Rochester Hills, MI (US); Xiaomeng Peng, Malden, MA (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 257 days.

(21) Appl. No.: 17/698,204

(22) Filed: Mar. 18, 2022

(65) Prior Publication Data
US 2023/0294554 A1 Sep. 21, 2023

(51) Int. Cl.
| | |
|---|---|
| *B60L 58/16* | (2019.01) |
| *G01R 31/367* | (2019.01) |
| *G01R 31/392* | (2019.01) |

(52) U.S. Cl.
CPC ............ *B60L 58/16* (2019.02); *G01R 31/367* (2019.01); *G01R 31/392* (2019.01)

(58) Field of Classification Search
CPC .......... B60L 58/16; B60L 3/0046; B60L 3/12; B60L 2240/545; B60L 58/12; G01R 31/367; G01R 31/392
USPC ....................................................... 701/34.4
See application file for complete search history.

(56) References Cited

U.S. PATENT DOCUMENTS

| | | | | |
|---|---|---|---|---|
| 9,933,338 | B2* | 4/2018 | Noda | ................. G05B 23/0283 |
| 10,209,314 | B2* | 2/2019 | Garcia | ................. G01R 31/392 |
| 2015/0160098 | A1* | 6/2015 | Noda | .................... G01M 99/00 |
| | | | | 702/35 |
| 2018/0143257 | A1* | 5/2018 | Garcia | ................. G01R 31/382 |

FOREIGN PATENT DOCUMENTS

| | | | |
|---|---|---|---|
| CN | 112505570 A | * | 3/2021 |
| JP | 5530045 B1 | * | 6/2014 |
| TW | 1517994 B | * | 1/2016 |

* cited by examiner

*Primary Examiner* — Muhammad Shafi
(74) *Attorney, Agent, or Firm* — CANTOR COLBURN LLP

(57) ABSTRACT

A system for monitoring a battery assembly includes a processing device configured to receive measurement data from a plurality of battery components, and input the measurement data to a battery model configured to determine parametric data. Based on the battery model, the processing device is configured to acquire the parametric data, extract statistical information based on at least one parameter of each battery component, and input the statistical information to a failure identification module that includes a first classifier configured to determine whether the battery assembly is in a failure condition based on the statistical information. The processing device is configured to output a health indicator having a first value indicating that the battery assembly is healthy based on first classifier determining that the battery assembly is in the healthy condition, and a faulty value based on the first classifier determining that the battery assembly is in a failure condition.

20 Claims, 8 Drawing Sheets

BATTERY HEALTH MONITORING AND FAILURE IDENTIFICATION

INTRODUCTION

The subject disclosure relates to batteries and battery assemblies, and more particularly to monitoring of battery health.

Vehicles, including gasoline and diesel power vehicles, as well as electric and hybrid electric vehicles, feature battery storage for purposes such as powering electric motors, electronics and other vehicle subsystems. As battery technology progresses and new battery types are introduced, it can be challenging to monitor battery health and identify failure or fault conditions. Accordingly, it is desirable to provide a system that can monitor battery health for detection of faults, failures and other effects.

SUMMARY

In one exemplary embodiment, a system for monitoring a battery assembly includes a processing device configured to receive measurement data from a plurality of battery components. The processing device is configured to input the measurement data to a battery model, the battery model configured to determine battery parametric data, the parametric data configured to be used to determine whether the battery assembly is in a healthy condition. Based on the battery model, the processing device is configured to acquire the parametric data, extract statistical information based on at least one parameter of each battery component of the plurality of battery components, and input the statistical information to a failure identification module, the failure identification module including a first classifier configured to determine whether the battery assembly is in a failure condition based on the statistical information. The processing device is further configured to output a health indicator, the health indicator having a first value indicating that the battery assembly is healthy based on first classifier determining that the battery assembly is in the healthy condition, and the health indicator having a faulty value based on the first classifier determining that the battery assembly is in a failure condition.

In addition to one or more of the features described herein, the battery assembly includes a battery pack, and the plurality of battery components include a plurality of battery modules.

In addition to one or more of the features described herein, the battery assembly includes a battery module, and the plurality of battery components include a plurality of battery cells housed in the module.

In addition to one or more of the features described herein, the processing device is configured to adjust the battery model based on at least one of temperature and state of charge to reduce environmentally induced effects on the measurement data.

In addition to one or more of the features described herein, the failure identification module includes a hierarchical classifier structure that includes the first classifier and a group of additional classifiers, each classifier of the group of additional classifiers configured to classify the battery assembly based on a respective failure mode.

In addition to one or more of the features described herein, the failure identification module is configured to provide the statistical information to each additional classifier based on the first classifier determining that the battery assembly is in the failure condition, and determine a failure mode based on the statistical information falling into a class of at least one additional classifier.

In addition to one or more of the features described herein, the failure identification module is configured to identify a new failure mode and generate a new classifier based on the statistical information not falling into a class of any existing classifiers.

In addition to one or more of the features described herein, the measurement data corresponds to measurements taken for a single sample time.

In addition to one or more of the features described herein, the processing device is configured to output the health indicator for a plurality of sets of measurement data, each set corresponding to a sample time within a time period of a vehicle trip, and determine whether the battery assembly is healthy based on values of the health indicator.

In one exemplary embodiment, a method of monitoring a battery assembly includes receiving measurement data from a plurality of battery components of the battery assembly, and inputting the measurement data to a battery model, the battery model configured to determine battery parametric data, the parametric data configured to be used to determine whether the battery assembly is in a healthy condition. The method also includes, based on the battery model, acquiring the parametric data, extracting statistical information based on at least one parameter of each battery component of the plurality of battery components, and inputting the statistical information to a failure identification module, the failure identification module including a first classifier configured to determine whether the battery assembly is in a failure condition based on the statistical information. The method further includes outputting a health indicator, the health indicator having a first value indicating that the battery assembly is healthy based on the first classifier determining that the battery assembly is in the healthy condition, and the health indicator having a second value based on the first classifier determining that the battery assembly is in a failure condition.

In addition to one or more of the features described herein, the method includes adjusting the battery model based on at least one of temperature and state of charge to reduce environmentally induced effects on the measurement data.

In addition to one or more of the features described herein, the failure identification module includes a hierarchical classifier structure that includes the first classifier and a group of additional classifiers, each classifier of the group of additional classifiers configured to classify the battery assembly based on a respective failure mode.

In addition to one or more of the features described herein, the failure identification module is configured to provide the statistical information to each additional classifier based on the first classifier determining that the battery assembly is in the failure condition, and determine a failure mode based on the statistical information falling into a class of at least one additional classifier.

In addition to one or more of the features described herein, the failure identification module is configured to identify a new failure mode and generate a new classifier based on the statistical information not falling into a class of any existing classifiers.

In addition to one or more of the features described herein, the measurement data and parametric data corresponds to data obtained from a single sample time, and a processing device is configured to output the health indicator for a plurality of sets of measurement data, each set corresponding to a sample time within a time period of a vehicle trip, and determine whether the battery assembly is healthy based on values of the health indicator.

In one exemplary embodiment, a vehicle system includes a memory having computer readable instructions, and a processing device for executing the computer readable instructions, the computer readable instructions controlling the processing device to perform a method. The method includes receiving measurement data from a plurality of battery components of a battery assembly, and inputting the measurement data to a battery model, the battery model configured to determine battery parametric data, the parametric data configured to be used to determine whether the battery assembly is in a healthy condition. The method also includes, based on the battery model, acquiring the parametric data, extracting statistical information based on at least one parameter of each battery component of the plurality of battery components, and inputting the statistical information to a failure identification module, the failure identification module including a first classifier configured to determine whether the battery assembly is in a failure condition based on the statistical information. The method further includes outputting a health indicator, the health indicator having a first value indicating that the battery assembly is healthy based on the first classifier determining that the battery assembly is in the healthy condition, and the health indicator having a second value based on the first classifier determining that the battery assembly is in a failure condition.

In addition to one or more of the features described herein, the method further includes adjusting the battery model based on at least one of temperature and state of charge to reduce environmentally induced effects on the measurement data.

In addition to one or more of the features described herein, the failure identification module includes a hierarchical classifier structure that includes the first classifier and a group of additional classifiers, each classifier of the group of additional classifiers configured to classify the battery assembly based on a respective failure mode.

In addition to one or more of the features described herein, the failure identification module is configured to provide the statistical information to each additional classifier based on the first classifier determining that the battery assembly is in the failure condition, and determine a failure mode based on the statistical information falling into a class of at least one additional classifier.

In addition to one or more of the features described herein, the failure identification module is configured to identify a new failure mode and generate a new classifier based on the statistical information not falling into a class of any existing classifiers.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1:
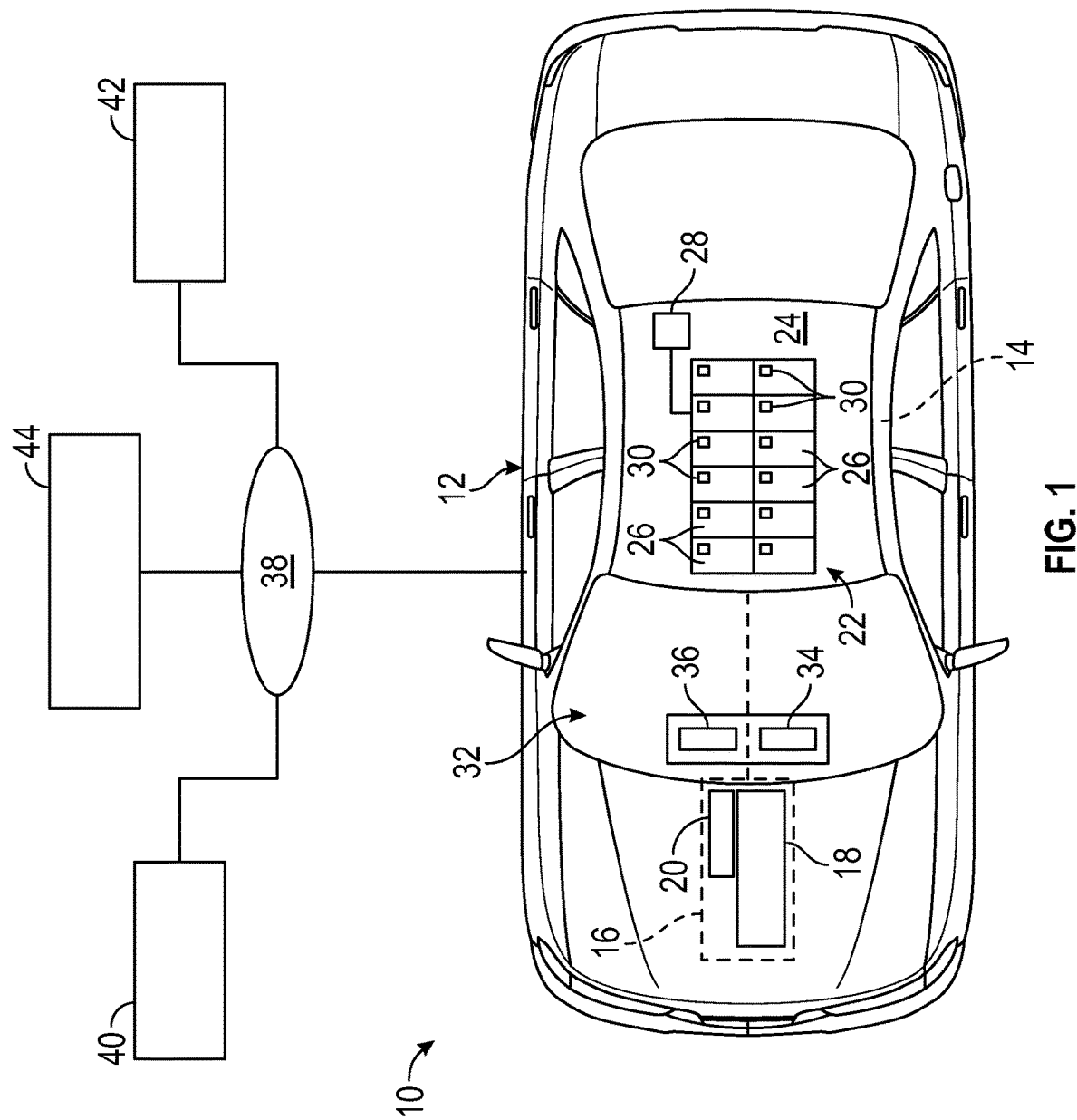
FIG. 1 is a top schematic view of a motor vehicle including a battery assembly and a monitoring system, in accordance with an exemplary embodiment.

The following description is merely exemplary in nature and is not intended to limit the present disclosure, its application or uses. It should be understood that throughout the drawings, corresponding reference numerals indicate like or corresponding parts and features.

In accordance with one or more exemplary embodiments, methods, devices and systems are provided for monitoring battery assemblies. One or more processing devices are configured to perform one or more methods for monitoring a battery assembly, such as a battery module or a battery pack in a vehicle.

One or more embodiments of a system for monitoring a battery assembly (e.g., a battery pack or battery module) include a processing device that may have any number of processors and/or processing modules. The system is configured to receive measurement data generated by one or more sensors in a vehicle, and determine whether the battery assembly is healthy (i.e., in a healthy condition) based on the measurement data and data from other vehicles (e.g., fleet data), using various models and/or processing modules. The system may also be configured to identify specific failure modes. Examples of failure modes include conditions related to high self-discharge, Lithium plating, internal short circuit, thermal runaway, solid electrolyte interphase (SEI) growth, and others. The system can make a health determination and/or failure mode identification on a sample or snapshot basis (i.e., using a set of measurement data taken at a specific time), or using measurement data acquired over a selected time period (e.g., a vehicle trip) or over multiple time periods (e.g., multiple vehicle trips).

Embodiments are discussed herein at the battery module level, in which a battery module is evaluated based on statistical features related to individual cells. However, the embodiments may be performed at the pack level, in which a battery pack is evaluated based on statistical features related to individual modules.

Embodiments described herein present numerous advantages and technical effects. For example, the embodiments provide for a robust system that can quickly detect and identify faulty vehicles under different noises and operating conditions. In addition, the embodiments provide for identification of previously unknown failure conditions or failure modes. The systems described herein can be easily incorporated into existing systems without requiring significant modifications. Thus, embodiments described herein address problems related to battery monitoring and provide solutions to such problems.

The embodiments are not limited to use with any specific vehicle or device or system that utilizes battery assemblies, and may be applicable to various contexts. For example, embodiments may be used with automobiles, trucks, aircraft, construction equipment, farm equipment, automated factory equipment and/or any other device or system that may use high voltage battery packs or other battery assemblies.

FIG. 1 shows an embodiment of a motor vehicle 10, which includes a vehicle body 12 defining, at least in part, an occupant compartment 14. The vehicle body 12 also supports various vehicle subsystems including a propulsion assembly 16, and other subsystems to support functions of the propulsion assembly 16 and other vehicle components, such as a braking subsystem, a suspension system, a steering subsystem, a fuel injection subsystem, an exhaust subsystem and others.

The vehicle may be a combustion engine vehicle, an electrically powered vehicle (EV) or a hybrid vehicle. In an example, the vehicle 10 is a hybrid vehicle that includes a combustion engine assembly 18 and an electric motor assembly 20.

The vehicle 10 includes a battery system 22, which may be electrically connected to the motor assembly 20 and/or other components, such as vehicle electronics. In an embodiment, the battery system 22 includes a high voltage battery pack 24 having a plurality of battery modules 26. Each of the battery modules 26 includes a number of individual cells (not shown). The battery system 22 may also include a monitoring unit 28 configured to receive measurements from sensors 30. Each sensor 30 may be an assembly or system having one or more sensors for measuring various battery and environmental parameters, such as temperature, current and voltages. The sensors 30 may be configured to measure parameters of a battery pack 26 and/or measure individual parameters of each cell therein. The monitoring unit 28 includes components such as a processor, memory, an interface, a bus and/or other suitable components.

The vehicle 10 also includes a computer system 32 that includes one or more processing devices 34 and a user interface 36. The various processing devices and units may communicate with one another via a communication device or system, such as a controller area network (CAN) or transmission control protocol (TCP) bus. In addition, the monitoring unit 28, the computer system 32 and/or other processing components in the vehicle may be configured to communicate with various remote devices and systems, for example, via a network 38 (e.g., cellular network, etc.). For example, the vehicle 10 may communicate with one or more mobile devices 40 (e.g., smartphone, tablet, etc.), a remote entity 42 (e.g., a workstation, a computer, a server, a service provider, technician, engineer, etc.), and/or a database or other storage location 44. The network 38 may be connected to various devices and systems, such as a vehicle or fleet monitoring system.

Figure 2:
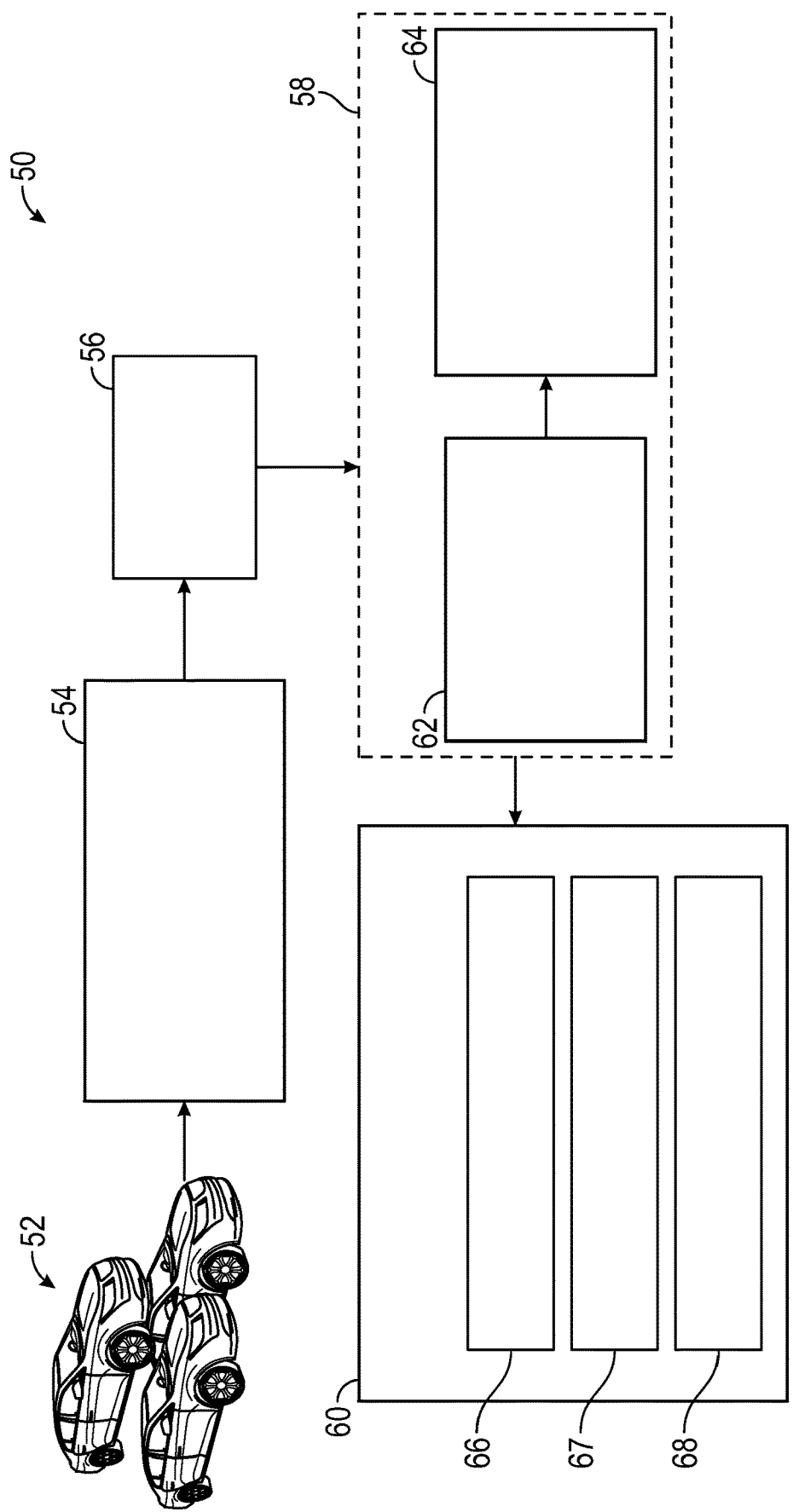
FIG. 2 depicts a system for monitoring battery health and identifying failure conditions, in accordance with an exemplary embodiment.

FIG. 2 schematically depicts various processing components of a vehicle battery monitoring system 50. The system 50 is configured to receive measurement data from the vehicle 10 and/or fleet data (referred to as "fleet measurement data") collected from one or more other vehicles, such as vehicles in a fleet 52. For example, a monitoring system or other device in the vehicle 10 collects measurement data such as voltages, currents, temperatures, state of charge estimations and others.

The measurement data is input to a physics-based battery model 54, which can be used to output parametric data (e.g., data that can help assess whether a battery assembly is in a "healthy" condition or a "faulty" condition). The battery model 54 may be constructed by collecting measurement data from vehicles known to have healthy battery assemblies (e.g., battery packs) and training the model 54, and/or by simulation. The battery model 54 can use various types of measurement data to derive various physics-based parameters of the battery, such as electrochemical properties (e.g., chemical makeup, energy density, etc.), electrical properties (e.g., capacity, power, etc.), thermal properties (e.g., heat capacity, thermal conductivity, etc.) and electro-thermal properties (e.g., temperature distribution).

The system 50 also includes a compensation module 56 for removing environmental effects on the parametric data, such as effects due to temperature and/or state of charge), and an extraction module 58 that receives compensated battery parametric data 62 and extracts statistical attributes 64 of the data 62. The statistical attributes 64 and/or the compensated data 62 are provided to a failure identification module 60.

The failure identification module 60 uses one or more classifiers and/or other machine learning components to provide health determinations and/or predictions. The failure identification module 60 provides health determinations and predictions based on measurement data, model outputs, and/or other sources of information (e.g., manufacturer specifications).

The module 60 uses one or more machine learning models, such as classifiers (e.g., one class classifiers), to determine whether a battery assembly is healthy, determine battery conditions that correspond to known failure modes, and/or identify new (previously unidentified) failure modes. A "failure mode" is any battery pack condition or operating mode associated with a failure, fault or other sub-optimal performance condition.

The failure identification module 60 may include components for making health determinations for a single time window or time (e.g., a sample time), and may also include components for making health determinations and predictions for multiple time windows or sample times over a selected time period. The time period may correspond to a vehicle trip or multiple vehicle trips. For example, the failure identification module 60 includes a snapshot module 66 for making a health determination for a measurement data set associated with a single time window, such as a sample time. A measurement data set taken for a single sample time is referred to herein as a "snapshot." The failure identification module 60 is configured to output a health notification that indicates whether the battery assembly is healthy or faulty. The health notification may identify a specific failure mode as discussed further herein, and may include any type of indicator indicative of whether the battery assembly is in a failure condition and/or specific failure mode.

The failure identification module 60 may also include a trip-level fusion module or trip decision fuser 67, which collects outputs (e.g., health notification values) from the snapshot module 66 for a plurality of time windows, and determines whether the battery assembly is faulty based on the outputs. The failure identification module 60 may further include vehicle-level fusion module or vehicle decision fuser 68 that collects outputs from the trip decision fuser for a plurality of trips and determines whether the battery assembly is faulty.

Figure 3:
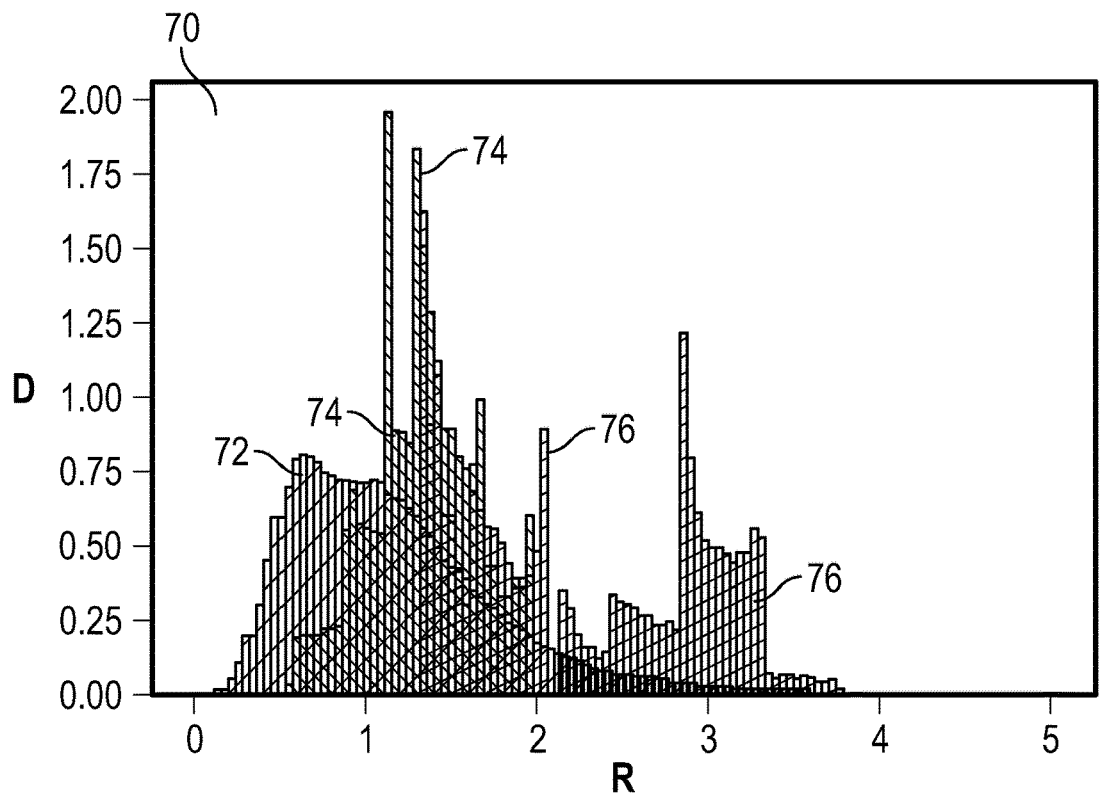
FIG. 3 depicts examples of data patterns as part of a battery model.

FIG. 3 depicts an example of a graph 70 representing battery assembly parametric data patterns that may be estimated as part of the battery model 54. The data patterns in this example are distributions of energy density as a function of resistance. A reference data pattern is represented by a histogram 72 of resistances (estimated parametric data using battery model 54) obtained from a vehicle fleet. Another reference pattern represents a healthy battery assembly, and is represented by a histogram 74 determined from the battery model 54 using measurements taken during a trip with a healthy battery assembly. The graph 70 also shows an example of a histogram 76 generated based on measurements taken from a faulty battery pack of the vehicle 10.

The temperature compensation module 56 adjusts or compensates the battery parametric data from the battery model 54 for various environmental conditions. Examples of such conditions include temperature and state of charge (SOC). The battery parametric data from the battery model 54 is adjusted to remove the environmental effects.

Figure 4:
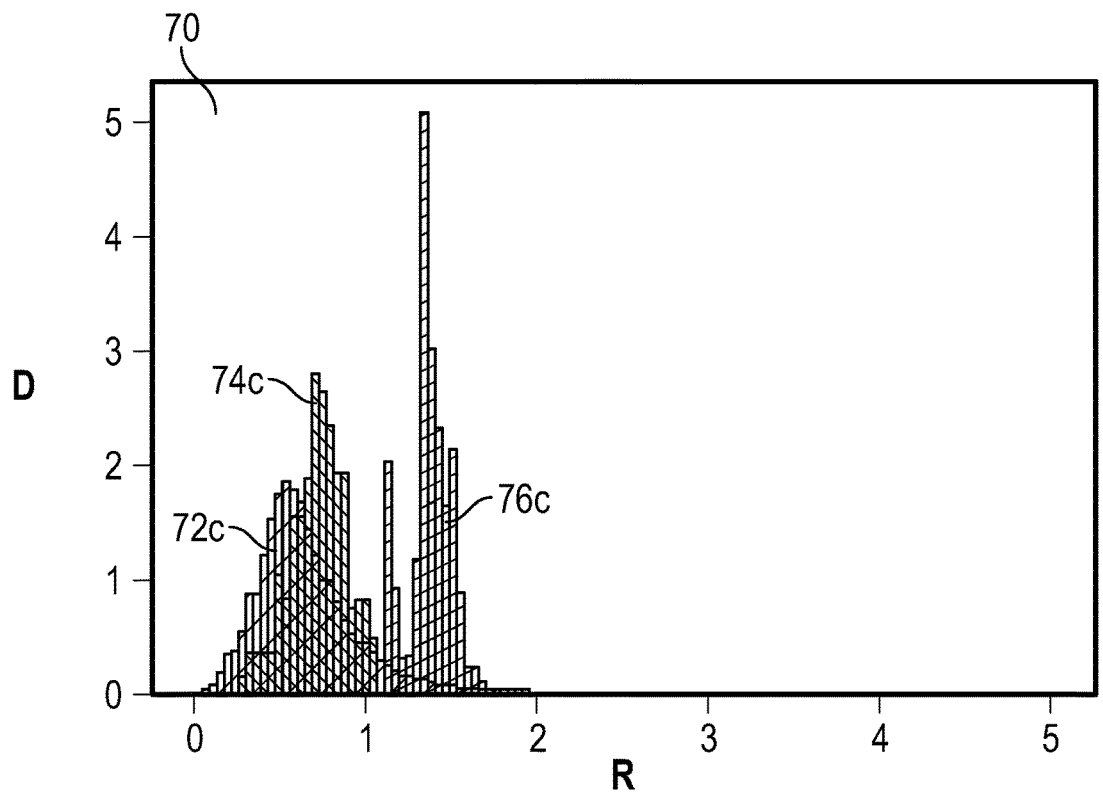
FIG. 4 depicts the data patterns of FIG. 3 after compensation due to environmental effects.

FIG. 4 depicts the data patterns of FIG. 3 as compensated using the compensation module 56. The data patterns are compensated by determining changes in resistance R vs density D due to temperature or SOC effects, and removing such changes. FIG. 4 shows a compensated histogram 72c resulting from adjustment of the histogram 72, a compensated histogram 74c resulting from adjustment of the histogram 74, and a compensated histogram 76c resulting from adjustment of the histogram 76. As shown, compensating for temperature and/or SOC effects provides better separation between healthy and faulty distributions (e.g., separation between the histograms 72c and 74c, and separation between the histograms 74c and 76c).

Figure 5A:
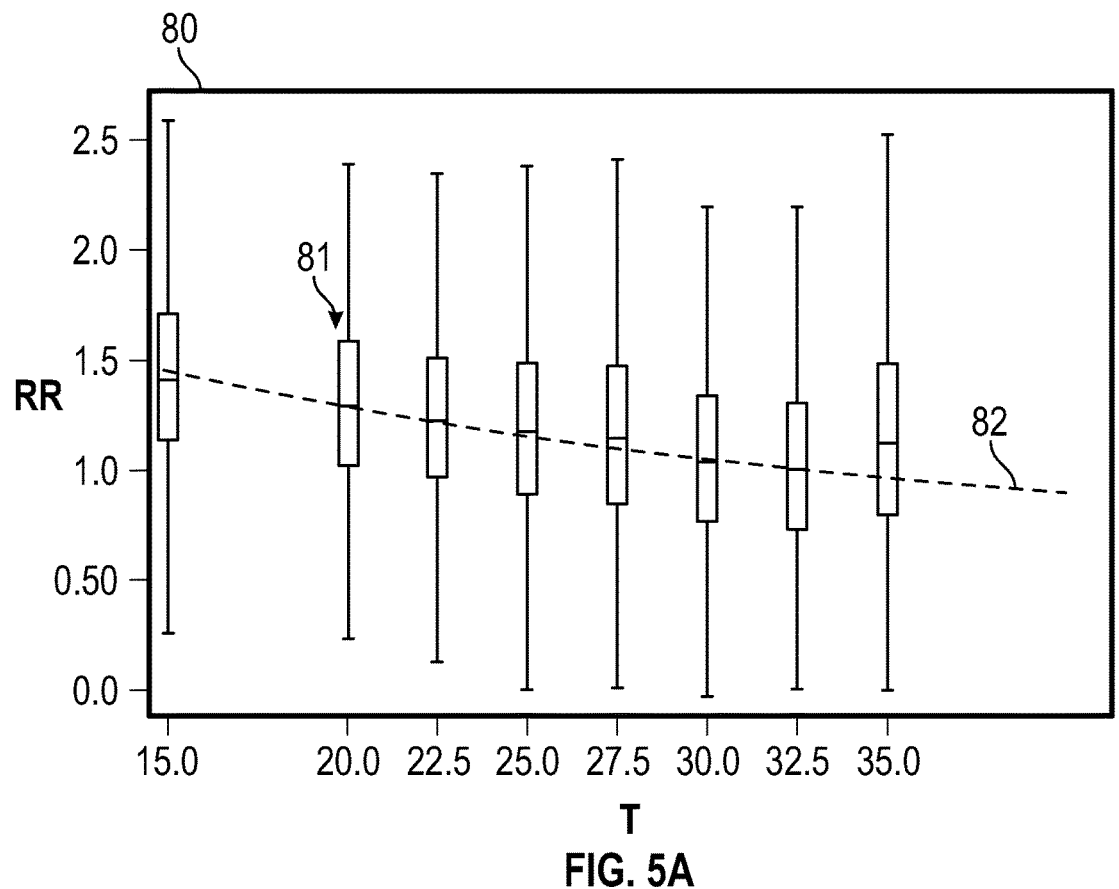
FIGS. 5A and 5B illustrate examples of a temperature compensation model and an example of a state of charge compensation model.
Figure 5B:
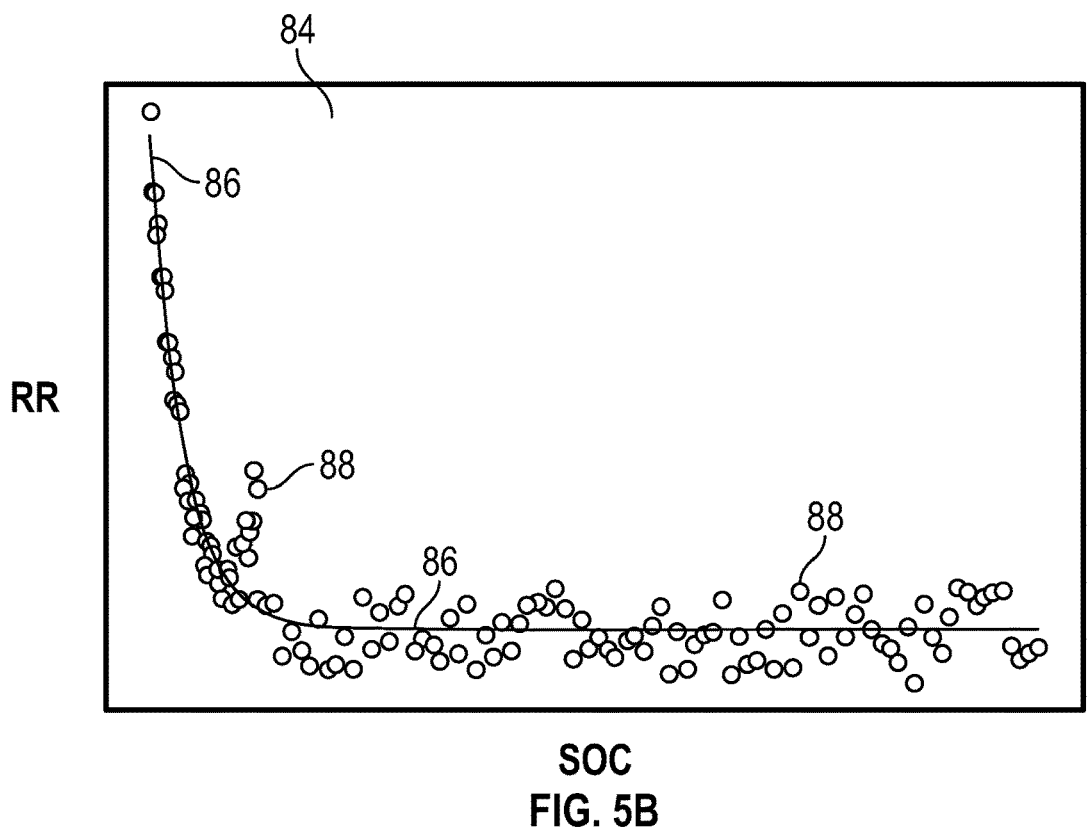

FIGS. 5A and 5B show examples of compensation models that can be used to adjust measurement data and/or data patterns based on temperature and other environmental effects. The following equations are examples of temperature compensation models, represented as functions $f(T)$:

$$f(T) = R_0 \cdot (a(T-t_0) + b)$$

$$f(T) = R_0 \cdot (a(T-t_0)^3 + a(T-t_0)^2 + c(T-t_0) + d)$$

$$f(T, SoC, I)$$

In the above functions, T is measured temperature, and $R_0$ is a base resistance at a reference temperature $t_0$. a, b and c are coefficients derived from fleet data. SoC is state of charge, and I is current.

FIG. 5A depicts a graph 80 including a box plot 81 of temperature as a function of a resistance ratio RR. The resistance ratio is a ratio of resistance at a measured temperature T to resistance at the reference temperature $R(t_0)$, which in this example is R(25 degrees C.). This example is an exponential model represented by the function:

$$R(T) = R_0 \cdot (Ke^{-E_a/T} A_R)$$

where K, $E_a$ and $A_R$ are parameters learned from fleet data. Temperature compensation in this example includes adjusting resistance values in a data pattern based on the ratio and temperature using a curve 82.

FIG. 5B depicts a two-dimensional graph 84 of resistance as a function of SOC, including an example of a model represented by a curve 86 that has been fitted to collected sample values 88. This example is a polynomial model that can be used to adjust data patterns to remove effects due to SOC. The polynomial model could be of the form represented by the equation:

$$R(SoC) = (a \cdot SoC^2 + b \cdot SoC + c) R_b,$$

where SoC is a measured SOC, and $R_b$ is a base resistance (e.g., 30%). SOC compensation in this example includes adjusting resistance values in a data pattern based on the above function.

Figure 6:
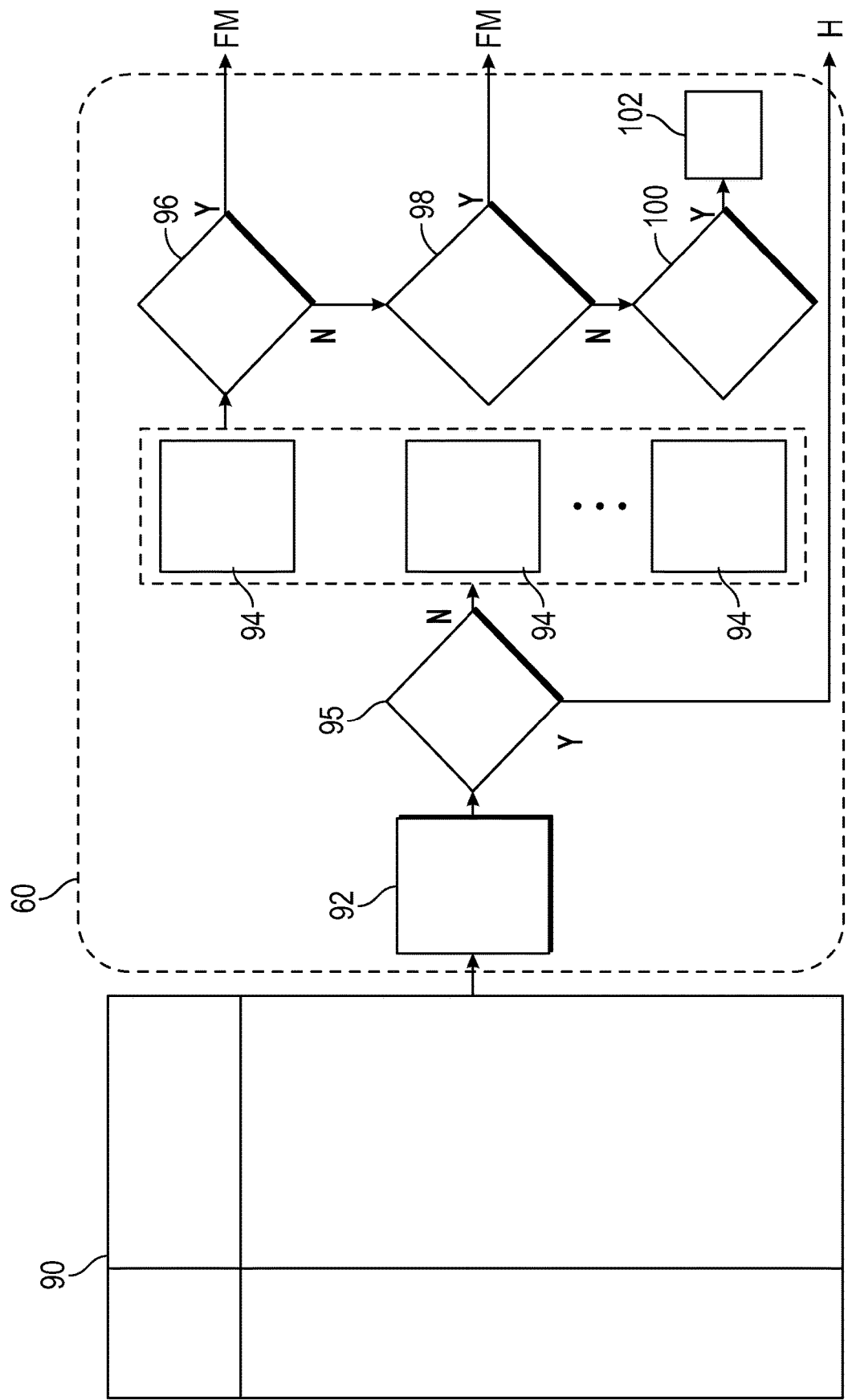
FIG. 6 depicts a failure identification module, in accordance with an exemplary embodiment.

FIG. 6 depicts an embodiment of the failure identification module 60. The failure identification module 60 receives statistical information 90, as well as measurement data and any other relevant information. The statistical information 90 is determined based on variations in measurement data among a plurality of components of a battery assembly (referred to as "battery components"). The components may be individual cells if a battery module is being monitored, or individual battery modules if a battery pack is being monitored. In the following discussion, the battery assembly is a battery module (e.g., a module 26 of FIG. 1), and the battery components are individual cells i.

The following table shows examples of statistical information derived from measurements and parametric data of each cell at a time t (e.g., a sample time):

| Operating/Driving Conditions | Statistical Information |
|---|---|
| SOC | $R_{min}$ |
| I | $R_{max}$ |
| T | $R_{avg}$ |
|  | $\Delta R_{max\_avg} = R_{max} - R_{avg}$ |
|  | $\Delta R_{avg\_min} = R_{avg} - R_{min}$ |
|  | $V_{min}$ |
|  | $V_{max}$ |
|  | $V_{avg}$ |
|  | $\Delta V_{max\_avg} = V_{max} - V_{avg}$ |
|  | $\Delta V_{avg\_min} = V_{avg} - V_{min}$ |
|  | $T_{min}$ |
|  | $T_{max}$ |
|  | $T_{avg}$ |
|  | $\Delta T_{max\_avg} = T_{max} - T_{avg}$ |
|  | $\Delta T_{avg\_min} = T_{avg} - T_{min}$ |

In the table, $R_{min}$ is a minimum resistance (value of R for the cell with the lowest resistance), $R_{max}$ is a maximum resistance (value of R for the cell with the highest resistance), and $R_{avg}$ is the average of the resistance of each cell.

$V_{min}$ is a minimum voltage (value of V for the cell with the lowest voltage), $V_{max}$ is a maximum voltage (value of V for the cell with the highest voltage), and $V_{avg}$ is the average voltage.

$T_{min}$ is a minimum temperature T, $T_{max}$ is a maximum temperature, and $T_{avg}$ is the average temperature. It is noted that any type of statistical measure may be used and is not limited to the following examples.

The failure identification module 60 receives the statistical information 90 for a given time window (e.g., a sample time). The statistical information 90 may be referred to as a "snapshot" 90. The snapshot 90 is input to a one class classifier 92 that is configured to analyze the statistical information, and determine whether the statistical information corresponds to one of two classes: a "healthy" class and a "faulty" class. The classifier 92 may be a one-class support vector machine (SVM), an isolation forest classifier, a deep autoencoder, a probabilistic model (e.g., a Gaussian mixture model) or a combination thereof. It is noted that the classifier 92, and other classifiers described herein, may be any type of machine learning or artificial intelligence algorithm that is trained using training data (e.g., derived from fleet data) to determine whether a snapshot corresponds to a failure condition or failure mode.

The failure identification module 60 also includes a group of n classifiers 94 configured to classify the snapshot 90 into classes corresponding to different failure modes. Each classifier 94, in an embodiment, is a one class classifier that is trained to determine whether the snapshot 90 fits into a class corresponding to a respective failure mode. In this way, if the classifier 92 determines that the snapshot 90 is not in the healthy class, the classifiers 94 can be used to identify specific causes for a failure (or potential failure). It is noted that a snapshot may fall into more than one class, and thus an output of the module 60 may include an identification of more than one failure mode.

In use, the module 60 receives or inspects a health indicator from the classifier 92, and identifies whether the snapshot 90 belongs to the healthy class, as represented by decision block 95. If the snapshot 90 is in the healthy class, the module 60 outputs an indication that the battery assembly is healthy via, for example an indicator H.

If the snapshot 90 is not in the healthy class, the snapshot 90 is input to each of the failure mode classifiers 94, and each classifier 94 outputs a respective result indicating whether the snapshot 90 falls into its respective class. The module 60 determines whether the snapshot 90 belongs to only one class (decision block 96), and if so, outputs a failure mode indicator FM that identifies the specific failure mode. If not, the module 60 determines whether the snapshot 90 falls into multiple classes (decision block 98), and if so, outputs a failure indicator FM which may identify each failure mode.

If the snapshot 90 does not fall into any of the classes (decision block 100), the module 60 may generate a new classifier 102 that has one class corresponding to this previously unidentified failure mode.

Figure 7:
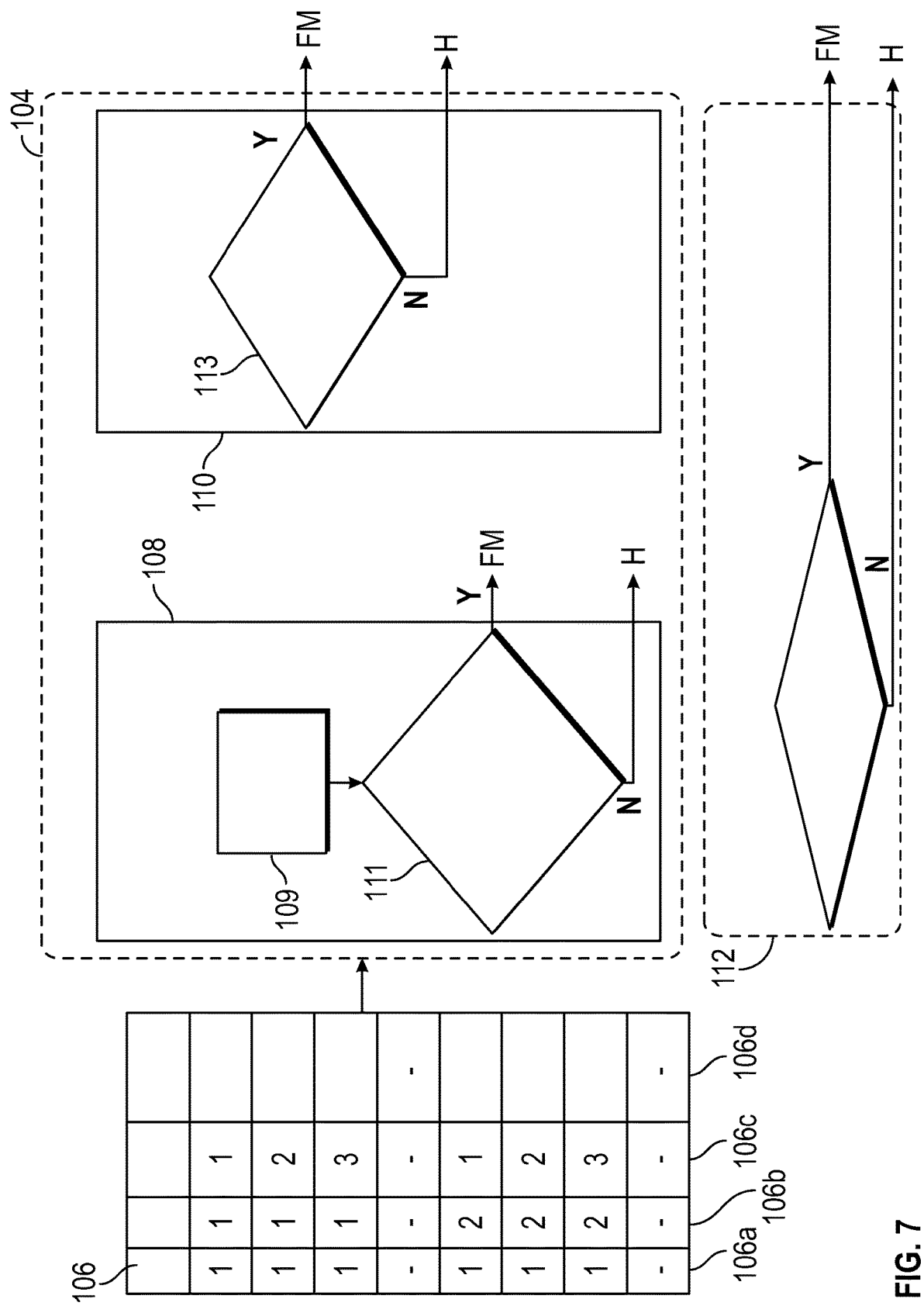
FIG. 7 depicts a trip fusion module and a vehicle fusion module, in accordance with an exemplary embodiment.

Referring to FIG. 7, in an embodiment, the monitoring system 50 includes components for aggregating results from the failure identification module 60 for multiple snapshots, and analyzing the snapshots to identify failures on a per-trip basis and/or based on multiple trips made by the vehicle 10.

For example, the monitoring system 50 includes a trip decision fuser 104 configured to receive a result from the module 60 (referred to as a "snapshot result" for each snapshot. A snapshot result may include an indicator value of healthy or faulty, an indicator value describing a failure mode, and/or a decision score that indicates a probability that a snapshot belongs to a healthy condition or a faulty condition.

The snapshot results are collected to generate a set of diagnostic results for a selected time period, such as a vehicle trip. FIG. 7 shows an example of diagnostic results 106 in the form of a table of indicator values corresponding to each snapshot 90, which may be indexed by vehicle and by trip. In the examples of FIG. 7, the diagnostic results 106 include a first column 106a having a vehicle identifier, a second column 106b having a trip index (e.g., trip 1, trip 2, etc.), a third column 106c having a snapshot index (e.g., snapshot 1, snapshot 2, etc.), and a fourth column 106d having health indicator values (e.g., Healthy, Faulty, Failure Mode 1, Failure Mode 2, etc.).

The diagnostic results 106 are input to the trip decision fuser 104, which determines a percentage of indicator values that indicate a failure mode. If the percentage is greater than or equal to a threshold value, the trip decision fuser 104 may output a failure mode indication. It is noted that the fuser 104 may evaluate the indicator values based on any suitable criteria, such as number of failure mode indications, frequency of failure mode indications and others.

The trip decision fuser 104 can determine the percentage (or other measure) using various strategies. For example, the fuser 104 includes a moving average estimator 108 that calculates a rolling average of faulty snapshots in a moving time window (represented by block 109). If the percentage meets the threshold in a window (as determined via decision block 111), the estimator 108 stops and outputs a failure mode indicator FM. If the percentage does not meet the threshold after the results are fully evaluated, the estimator 108 may output a healthy indicator H. In another example of a strategy, the fuser 104 includes a decision aggregator 110 that calculates a percentage of the total snapshots that are faulty and determines whether the percentage meets or exceeds a threshold (decision block 113). If the percentage meets (e.g., is greater than or equal to) the threshold, a failure mode indicator FM may be output; otherwise, a healthy indicator H may be output. In a further example of a strategy, the fuser 104 can output a faulty indicator if a number of consecutive faulty indicators exceeds a threshold. It is noted that the fuser 104 can use one or more of the above strategies.

In an embodiment, the monitoring system 50 includes a vehicle decision fuser 112 that aggregates results from the trip decision fuser 104. For example, each output from the trip decision fuser 104 represents an indicator (referred to as a "trip health indicator") for one of a plurality of vehicle trips. The outputs can be aggregated into a trip result and input to the vehicle decision fuser 112. For example, the trip result includes a trip health indicator value (e.g., healthy or failure mode) indexed to each trip. In an embodiment the length of consecutive trips with the same failure mode (i.e., the number of consecutive outputs from the fuser 104 counted backwards in time) is compared with a threshold to conclude if the failure mode presents in the vehicle (decision block 115). If the percentage meets (e.g., is greater than or equal to) the threshold, a failure mode indicator FM may be output; otherwise, a healthy indicator H may be output The vehicle decision fuser 112, determines the number of failure mode values and compares the number to a selected threshold. In an embodiment, the fuser 112 can predict a failure by stepping ahead of the trip duration and predicting the occurrence of faults in a future time window based on a pattern of occurrences of failure mode values.

Figure 8:
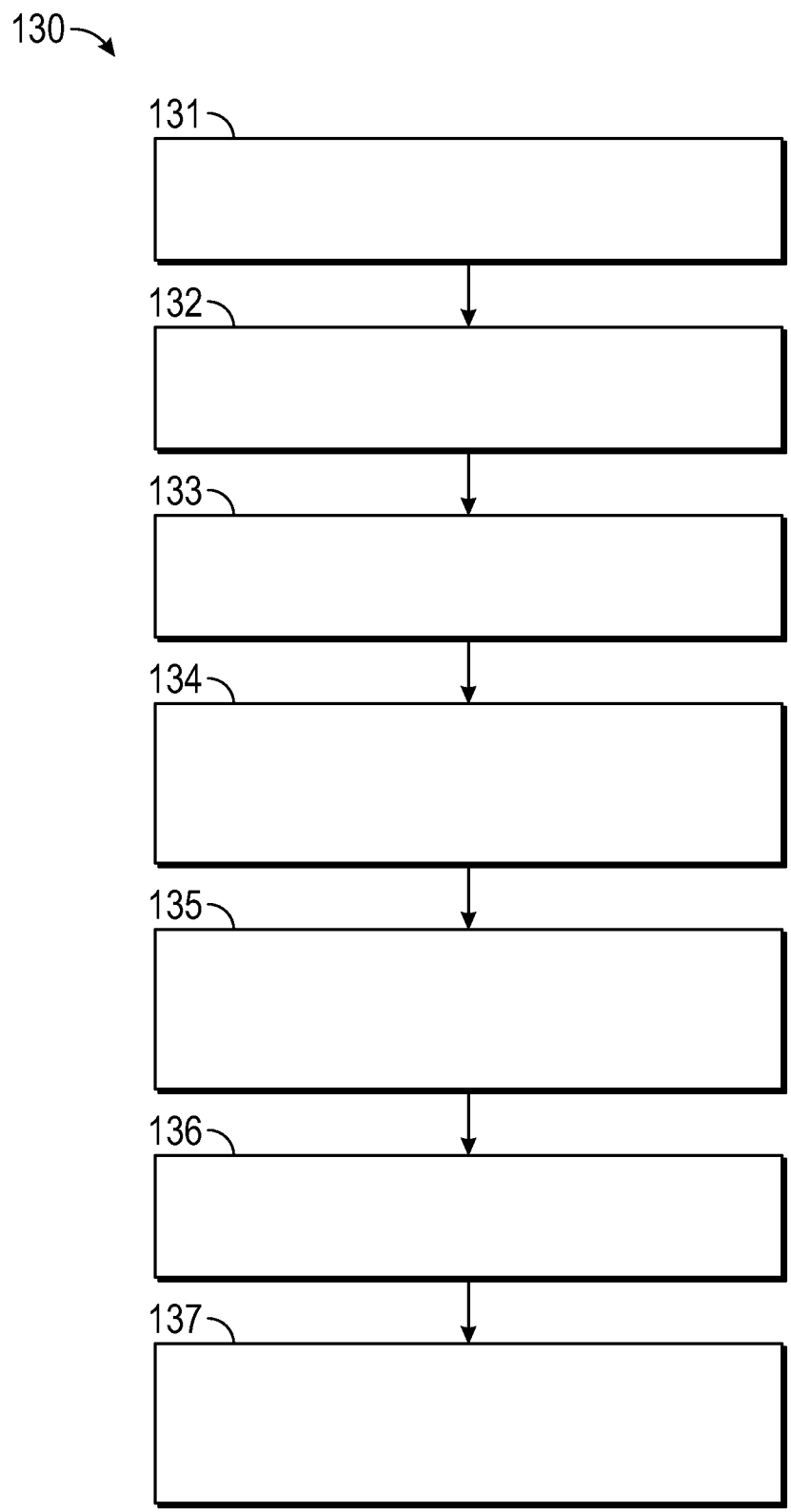
FIG. 8 is a flow diagram depicting aspects of a method of monitoring a battery assembly and/or detecting or identifying fault conditions, in accordance with an exemplary embodiment.

FIG. 8 illustrates embodiments of a method 130 of monitoring a battery assembly. Aspects of the method 130 may be performed by a processor or processors disposed in a vehicle (e.g., as an ECU or on-board computer), or a remote processor or processors (e.g., a server). It is noted the method 130 is not so limited and may be performed by any suitable processing device or system, or combination of processing devices.

The method 130 includes a number of steps or stages represented by blocks 131-137. The method 130 is not limited to the number or order of steps therein, as some steps represented by blocks 131-137 may be performed in a different order than that described below, or fewer than all of the steps may be performed.

At block 131, a processing device collects measurement data. For example, during a vehicle trip, measurements of voltage, current and other properties are taken at successive sample times.

At block 132, for each sample time, a set of measurement data is input to the battery model 54. The measurement data may be analyzed and processed by the battery model 54 to generate parametric data, such as an energy-resistance distribution. In an embodiment, the data pattern is adjusted for temperature effects by compensation module 56 as discussed herein. The battery model 54 outputs compensated parametric data.

At block 133, statistical information is extracted from the measurement data, and parametric data and/or compensated parametric data. The statistical information is collected as a snapshot.

At block 134, the snapshot is input to the failure identification module 60, which uses the one class classifier 92 to determine whether the measurement data belongs to a healthy class. For example, the classifier 92 determines whether the snapshot data is within a decision boundary representing a healthy class. If so, the module 60 outputs a "healthy" indicator.

At block 135, if the one class classifier 92 indicates that the snapshot does not belong to the healthy class, the snapshot is input to a plurality of failure mode classifiers 94. Each classifier 94 is configured to determine whether the snapshot falls within a class representing a respective failure mode.

Each classifier 94 outputs an indicator as to whether the snapshot falls within a respective class. If so, a failure mode indicator is output that identifies the specific failure mode or multiple failure modes are identified. If the snapshot belongs to more than one class, multiple indicators can be output or a result can be output that specifies each failure mode.

At block 136, if no failure modes are identified, the module 60 determines that a new failure mode has been identified, and generates a new classifier so that subsequent data can be analyzed and the new failure mode is identified in subsequent measurements.

At block 137, the analysis may be repeated for multiple snapshots, and the results for each snapshot are input to the trip decision fuser 104. Outputs from the fuser 104 may be provided to the vehicle decision fuser 112. Based on the outputs for the fusers, the system 50 outputs a diagnostic result for a vehicle trip and/or a result for the vehicle (based on multiple trips).

Figure 9:
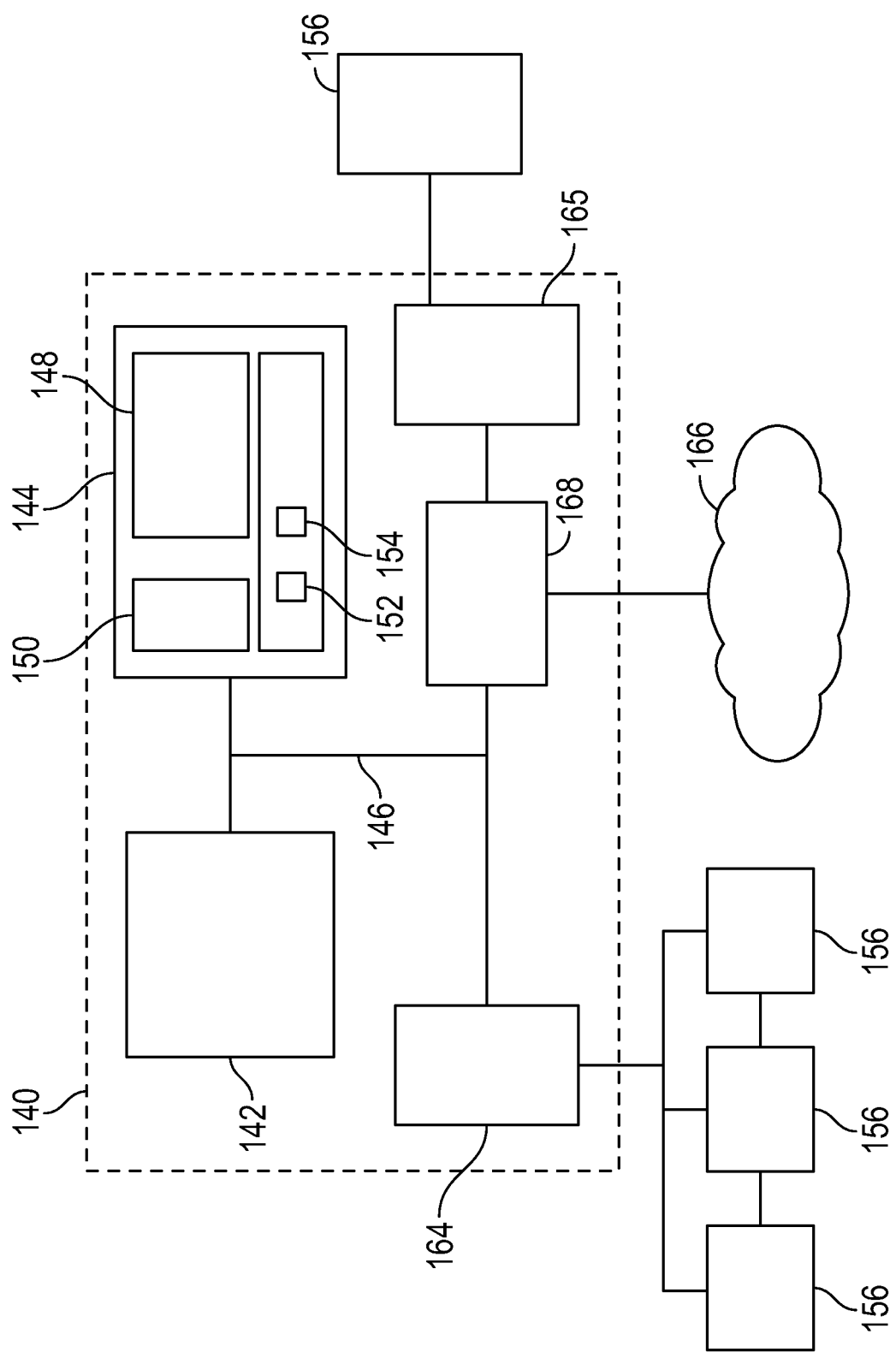
FIG. 9 depicts a computer system in accordance with an exemplary embodiment.

FIG. 9 illustrates aspects of an embodiment of a computer system 140 that can perform various aspects of embodiments described herein. The computer system 140 includes at least one processing device 142, which generally includes one or more processors for performing aspects of image acquisition and analysis methods described herein.

Components of the computer system 140 include the processing device 142 (such as one or more processors or processing units), a memory 144, and a bus 146 that couples various system components including the system memory 144 to the processing device 142. The system memory 144 can be a non-transitory computer-readable medium, and may include a variety of computer system readable media. Such media can be any available media that is accessible by the processing device 142, and includes both volatile and non-volatile media, and removable and non-removable media.

For example, the system memory 144 includes a non-volatile memory 148 such as a hard drive, and may also include a volatile memory 150, such as random access memory (RAM) and/or cache memory. The computer system 140 can further include other removable/non-removable, volatile/non-volatile computer system storage media.

The system memory 144 can include at least one program product having a set (e.g., at least one) of program modules that are configured to carry out functions of the embodiments described herein. For example, the system memory 144 stores various program modules that generally carry out the functions and/or methodologies of embodiments described herein. A module or modules 152 may be included to perform functions related to acquiring and processing measurement. A diagnostic module 154 may be included for analyzing measurement data and identifying failure conditions as described herein. The system 140 is not so limited, as other modules may be included. As used herein, the term "module" refers to processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality.

The processing device 142 can also communicate with one or more external devices 156 as a keyboard, a pointing device, and/or any devices (e.g., network card, modem, etc.) that enable the processing device 142 to communicate with one or more other computing devices. Communication with various devices can occur via Input/Output (I/O) interfaces 164 and 165.

The processing device 142 may also communicate with one or more networks 166 such as a local area network (LAN), a general wide area network (WAN), a bus network and/or a public network (e.g., the Internet) via a network adapter 168. It should be understood that although not shown, other hardware and/or software components may be used in conjunction with the computer system 40. Examples include, but are not limited to: microcode, device drivers, redundant processing units, external disk drive arrays, RAID systems, and data archival storage systems, etc.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A system for monitoring a battery assembly, comprising:
   a processing device configured to receive measurement data from a plurality of battery components, the processing device configured to perform:
   inputting the measurement data to a battery model, the battery model configured to determine battery parametric data, the parametric data configured to be used to determine whether the battery assembly is in a healthy condition; and
   based on the battery model, acquiring the parametric data, and performing:
      extracting statistical information based on at least one parameter of each battery component of the plurality of battery components;
      inputting the statistical information to a failure identification module, the failure identification module including a first classifier configured to determine whether the battery assembly is in a failure condition based on the statistical information; and
      outputting a health indicator, the health indicator having a first value indicating that the battery assembly is healthy based on first classifier determining that the battery assembly is in the healthy condition, and the health indicator having a faulty value based on the first classifier determining that the battery assembly is in a failure condition.

2. The system of claim 1, wherein the battery assembly includes a battery pack, and the plurality of battery components include a plurality of battery modules.

3. The system of claim 1, wherein the battery assembly includes a battery module, and the plurality of battery components include a plurality of battery cells housed in the module.

4. The system of claim 1, wherein the processing device is configured to adjust the battery model based on at least one of temperature and state of charge to reduce environmentally induced effects on the measurement data.

5. The system of claim 1, wherein the failure identification module includes a hierarchical classifier structure that includes the first classifier and a group of additional classifiers, each classifier of the group of additional classifiers configured to classify the battery assembly based on a respective failure mode.

6. The system of claim 5, wherein the failure identification module is configured to provide the statistical information to each additional classifier based on the first classifier determining that the battery assembly is in the failure condition, and determine a failure mode based on the statistical information falling into a class of at least one additional classifier.

7. The system of claim 5, wherein the failure identification module is configured to identify a new failure mode and generate a new classifier based on the statistical information not falling into a class of any existing classifiers.

8. The system of claim 1, wherein the measurement data corresponds to measurements taken for a single sample time.

9. The system of claim 8, wherein the processing device is configured to output the health indicator for a plurality of sets of measurement data, each set corresponding to a sample time within a time period of a vehicle trip, and determine whether the battery assembly is healthy based on values of the health indicator.

10. A method of monitoring a battery assembly, comprising:
receiving measurement data from a plurality of battery components of the battery assembly;
inputting the measurement data to a battery model, the battery model configured to determine battery parametric data, the parametric data configured to be used to determine whether the battery assembly is in a healthy condition;
based on the battery model, acquiring the parametric data, extracting statistical information based on at least one parameter of each battery component of the plurality of battery components;
inputting the statistical information to a failure identification module, the failure identification module including a first classifier configured to determine whether the battery assembly is in a failure condition based on the statistical information; and
outputting a health indicator, the health indicator having a first value indicating that the battery assembly is healthy based on the first classifier determining that the battery assembly is in the healthy condition, and the health indicator having a second value based on the first classifier determining that the battery assembly is in a failure condition.

11. The method of claim 10, further comprising adjusting the battery model based on at least one of temperature and state of charge to reduce environmentally induced effects on the measurement data.

12. The method of claim 10, wherein the failure identification module includes a hierarchical classifier structure that includes the first classifier and a group of additional classifiers, each classifier of the group of additional classifiers configured to classify the battery assembly based on a respective failure mode.

13. The method of claim 12, wherein the failure identification module is configured to provide the statistical information to each additional classifier based on the first classifier determining that the battery assembly is in the failure condition, and determine a failure mode based on the statistical information falling into a class of at least one additional classifier.

14. The method of claim 12, wherein the failure identification module is configured to identify a new failure mode and generate a new classifier based on the statistical information not falling into a class of any existing classifiers.

15. The method of claim 10, wherein the measurement data and parametric data corresponds to data obtained from a single sample time, and wherein a processing device is configured to output the health indicator for a plurality of sets of measurement data, each set corresponding to a sample time within a time period of a vehicle trip, and determine whether the battery assembly is healthy based on values of the health indicator.

16. A vehicle system comprising:
a memory having computer readable instructions; and
a processing device for executing the computer readable instructions, the computer readable instructions controlling the processing device to perform a method including:
receiving measurement data from a plurality of battery components of a battery assembly;
inputting the measurement data to a battery model, the battery model configured to determine battery parametric data, the parametric data configured to be used to determine whether the battery assembly is in a healthy condition;
based on the battery model, acquiring the parametric data, extracting statistical information based on at least one parameter of each battery component of the plurality of battery components;
inputting the statistical information to a failure identification module, the failure identification module including a first classifier configured to determine whether the battery assembly is in a failure condition based on the statistical information; and
outputting a health indicator, the health indicator having a first value indicating that the battery assembly is healthy based on the first classifier determining that the battery assembly is in the healthy condition, and the health indicator having a second value based on the first classifier determining that the battery assembly is in a failure condition.

17. The vehicle system of claim 16, wherein the method further includes adjusting the battery model based on at least one of temperature and state of charge to reduce environmentally induced effects on the measurement data.

18. The vehicle system of claim 16, wherein the failure identification module includes a hierarchical classifier structure that includes the first classifier and a group of additional classifiers, each classifier of the group of additional classifiers configured to classify the battery assembly based on a respective failure mode.

19. The vehicle system of claim 18, wherein the failure identification module is configured to provide the statistical information to each additional classifier based on the first classifier determining that the battery assembly is in the failure condition, and determine a failure mode based on the statistical information falling into a class of at least one additional classifier.

20. The vehicle system of claim 18, wherein the failure identification module is configured to identify a new failure mode and generate a new classifier based on the statistical information not falling into a class of any existing classifiers.

* * * * *